United States Patent [19]

McIntosh et al.

[11] 4,289,719
[45] Sep. 15, 1981

[54] METHOD OF MAKING A MULTI-LAYER CERAMIC SUBSTRATE

[75] Inventors: Charles M. McIntosh, Orlando, Fla.; Arnold F. Schmeckenbecher, Poughkeepsie, N.Y.

[73] Assignee: International Business Machines Corporation, Armonk, N.Y.

[21] Appl. No.: 749,482

[22] Filed: Dec. 10, 1976

[51] Int. Cl.³ .............................................. C04B 39/08
[52] U.S. Cl. ...................................... 264/61; 264/63; 264/86; 264/133; 264/135; 264/332
[58] Field of Search ............... 264/61, 133, 332, 63, 264/86, 135

[56] References Cited

U.S. PATENT DOCUMENTS

| | | | |
|---|---|---|---|
| 2,365,535 | 12/1944 | Fischer | 264/133 |
| 3,250,833 | 5/1966 | Wagner | 264/133 |
| 3,436,451 | 4/1969 | Wasser | 264/332 |
| 3,540,894 | 11/1970 | McIntosh | 264/61 |
| 3,948,706 | 4/1976 | Schmeckenbecher | 264/61 |
| 3,988,405 | 10/1976 | Smith et al. | 264/61 |

Primary Examiner—John Parrish
Attorney, Agent, or Firm—Wolmar J. Stoffel

[57] ABSTRACT

A method of making a multi-layer ceramic substrate for an integrated circuit device package having internal circuitry by forming a plurality of porous ceramic bisque sheets, impregnating the pores of the bisque sheets with an organic binder material, forming openings through the impregnated bisque sheets, filling the openings with conductive material and imprinting conductive circuitry patterns on the surface of the impregnated bisque sheets of a conductive material, assembling the plurality of apertured printed impregnated bisque sheets into a laminated unit, and sintering the laminated unit to form a unitary laminated structure having an interconnected internal circuitry system.

21 Claims, 7 Drawing Figures

METHOD OF MAKING A MULTI-LAYER CERAMIC SUBSTRATE

BACKGROUND OF THE INVENTION

The present invention relates to methods of forming multi-level ceramic packages for micro-electronic applications, more particularly an improved method for eliminating problems caused by dimensional instability of green ceramic sheets prior to sintering.

A common method for fabricating multi-level ceramic micro-electronic structures consists of forming ceramic material into a flexible tape, cutting the tape into sheets, referred to as green sheets, forming via holes at predetermined locations in the separate sheets, depositing conductive paste on the desired areas of the separate sheets and in the via holes, stacking the sheets upon one another, registering them, and subjecting them to relatively high sintering temperatures for a period of time long enough to burn out the organic binding material and to subsequently reforming the ceramic particles into the solid unit which is substantially impervious. During sintering the ceramic sheets undergo relatively large shrinkage which must be accomodated at earlier stages in the process to obtain the desired finished size. Subsequently top and bottom metallurgy patterns are applied to these unitary sintered package substrate and pins or other fixtures attached for making external connections. Semiconductor devices are also attached to the top side by a suitable technique, preferably by flip-chip bonding. An automated embodiment of this process is described and claimed in U.S. Pat. No. 3,518,765.

The ceramic green sheet, before it is ultimately laminated and sintered, must undergo a significant amount of processing. This processing, which includes the forming of via holes, filling of the via holes with conductive paste, and the forming of circuit patterns, takes significant amounts of time. Add to this the additional time it takes to cut the green ceramic sheet as it comes from the doctor blade castor, inspecting the sheets, punching alignment holes and then the related sorting and cataloging operations and the time that the green ceramic sheet remains in this form becomes quite lengthy. Green ceramic sheet is inherently dimensionally unstable since it includes volatile organic resin solvents and plasticizers which can evaporate and change the overall composition and also with it the dimensions. Further it can also absorb moisture, and/or possibly react with atmospheric elements. Thus the dimensional instability can present very serious problems, particularly when the technology embodies very small conductive metallurgy and closely spaced holes. Dimensional changes may result in misalignment of metal patterns on a green sheet and the conductive material in the via holes of the overlying ceramic green sheet.

SUMMARY OF THE INVENTION

It is an object of this invention to provide new methods of producing sinterable ceramic sheets and also new dimensionally stable sinterable ceramic sheets in the fabrication of multi-layer ceramic units which avoid the dimensional instability of the more conventional green sheet materials.

Another object of this invention is to provide improved methods for forming dimensionally stable ceramic bisque sheets that can be subjected to the conventional processing operations.

Yet another object of this invention is to provide new methods for imprinting circuit patterns of a conductive material on sinterable ceramic sheets in a process for forming multi-layer ceramic packages.

In accordance with the invention the method of making a multi-layer ceramic substrate for an integrated circuit device package having internal circuitry comprises, forming a plurality of porous ceramic bisque sheets, impregnating the pores of the bisque sheets with organic binder material, forming openings through the impregnated bisque sheets, filling the openings with conductive material, imprinting conductive circuitry patterns on the surface of the impregnated bisque sheets, assembling the plurality of apertured printed impregnated bisque sheets into a laminated unit, and sintering the laminated unit to form a unitary laminated structure having an interconnected internal circuitry system.

DESCRIPTION OF THE PREFERRED EMBODIMENTS

A wide variety of structures can be made according to the teachings of the present invention. However the fabrication of a multi-layer ceramic micro-electronic package is of primary interest and will be described in reference to the drawings. It is believed apparent that the general process can be used advantageously to fabricate other structures, as for example, a capacitor wherein the dielectric material is ceramic.

Figures 1, 2:
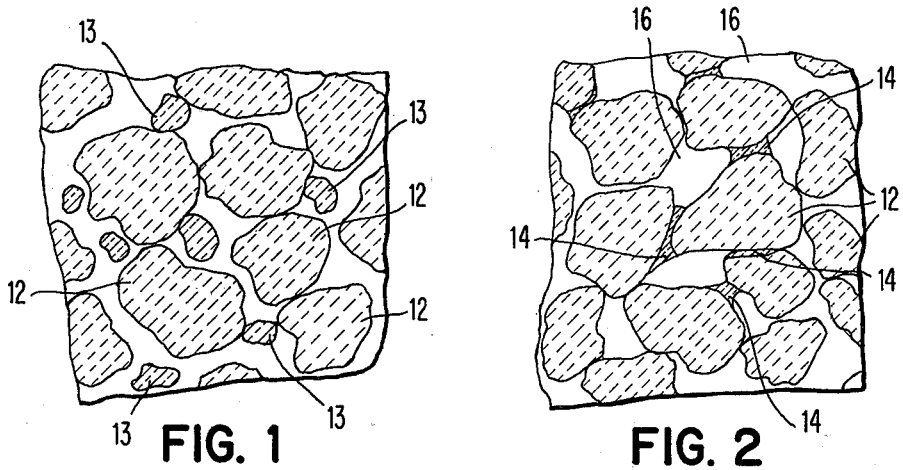
FIGS. 1, 2 and 3 are magnified views of the pore structure of ceramic material taken at three different stages of the process of the invention.
Figure 4:
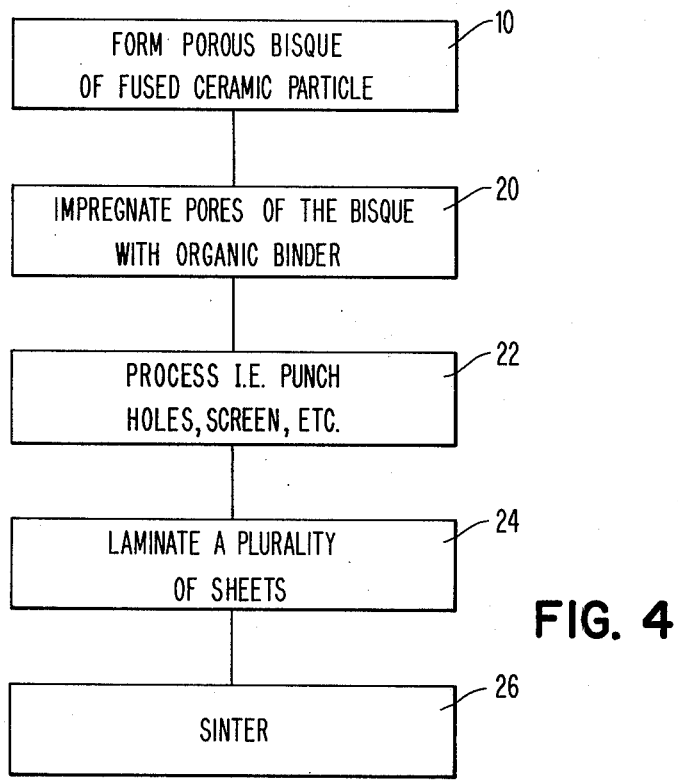
FIG. 4 is a flow diagram illustrating the operations performed in forming a multi-layer ceramic package.
Figure 5A:
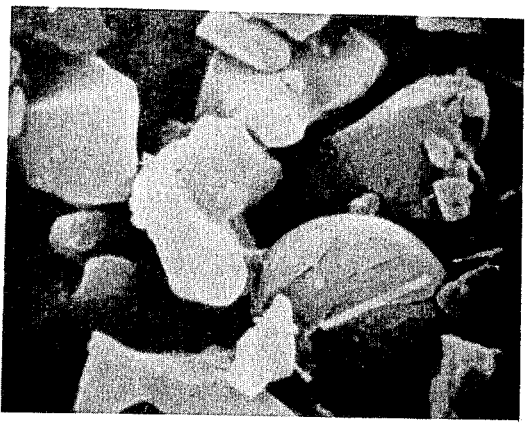
FIGS. 5A, 5B and 5C are micrographics of grain structures of a green ceramic sheet, a porous ceramic bisque and a sintered ceramic structure, respectively.
Figure 5B:
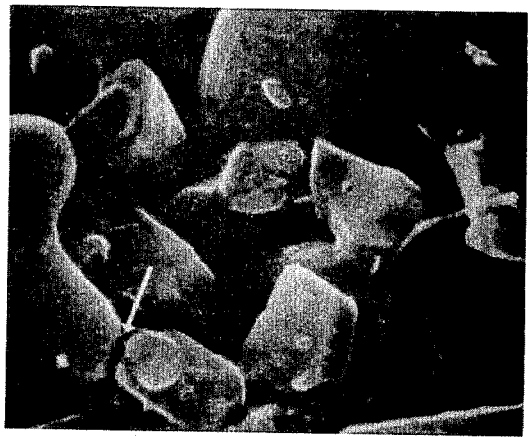

The first step in the process is indicated in FIG. 4 in box 10 of the flow chart. The general objective is to form a porous bisque of fused ceramic particles which serves as a skeleton-like structure that is dimensionally stable. The particulate structure of the porous bisque is indicated in FIG. 2 wherein particles 12 of relatively high melting ceramic materials are fused together, as in the preferred embodiment by a thin layer 14 of a lower melting glass material. At this stage of the process the porosity of the sheet is of the order of 40%, more generally in the range of 30 to 55% and even more generally in the range of 15 to 70%. As indicated in FIG. 2 spaces 16 are pores. This general structure is indicated in FIG. 5B of the drawings which is a micrograph of a ceramic bisque sheet in greatly enlarged sections. The microstructure depicted in FIG. 2 is dimensionally stable because it is a unitary interconnected matrix of stable material i.e., ceramic particles joined together as a single unit. The structure can be processed i.e., holes punched, screened etc., as will be explained in greater detail.

The structure depicted in the FIG. 2 can be obtained in a number of different ways. A first preferred technique for obtaining the structure is to prepare ceramic green sheet, as is well known in the art, and subsequently heat the sheet preferably at a low temperature on the order of 450° for a time sufficient to burn off the organic binder material and subsequently at a second higher temperature to cause the glass particles to soften. FIG. 1 depicts the particulate structure of green ceramic sheet after the initial burn-off to remove the organic binder. Note that unlike FIG. 2, the structure includes discrete glass particles 13 interspersed between ceramic particles 12. The micrograph of FIG. 5A illustrates the same structure. When the glass particles 13 soften sufficiently during heating, surface tension will cause them to be displaced to where the ceramic particles 12 contact each other. A slip or slurry is prepared which includes a high melting ceramic powdered material, a lower melting powdered glass material, an organic resin binding material, a volatile solvent for the resin binder, and possibly a plasticizer material. Typical high melting ceramic powdered materials are $Al_2O_3$, $TiO_2$, barium oxide, calcium oxide and the like. Typical lower melting glass material can be lead silicate, glass, mixtures which include lead silicate, borosilicate glasses, and soda-lime glasses. The resin binder materials are typically a polyvinyl butyral, vinylchlorideacetate co-polymer, and the like. The solvents can be trichloro ethylene, methyl ethyl ketone, methylalcohol, cyclohexanone, toluene. Typical plasticizers are dibutyl phthalate, butyl benzyl phthalate, dioctylphthalate and the like. The aforementioned materials are mixed into a slurry, and doctor bladed on a suitable support such as a mylar sheet. The doctor bladed material is then dried in an oven, at typically a few degrees above room temperature, at which time the solvent, which has a higher vapor pressure, evaporates leaving a pliable, flexible green ceramic sheet which when following the teaching of the prior art is normally processed by punching via holes, filling the holes with conductive paste, and screening conductive patterns on the surface. In the method of this invention however, the green sheet is heated at a temperature sufficiently high to burn off the resin binder material, typically 450° C., and subsequently at a higher temperature to melt the lower melting glass particles which serves as a "glue" to fuse the ceramic particles into a porous matrix. In practice the green sheet is placed in an oven at approximately 450° C. and the temperature increased to the softening point in the glass which is typically on the order of 1100° to 1250° C.

Another technique for forming the porous bisque sheet is by preparing a mixture of a high melting powdered ceramic material and a lower melting glass material and subsequently hot pressing the mixture at a temperature above the softening point of the glass material but below the softening point of the ceramic material. During the hot pressing operation the glass particles melt to form the aforementioned porous bisque wherein the glass secure the ceramic particles together.

Yet another method of preparing the porous bisque is to prepare a powdered ceramic material having a low firing temperature, such as ceramics which include lead silicate. The ceramic powdered material is then hot pressed at the firing temperature of the material but for a time sufficient only to partially melt the particles and result in their being fused together without reforming.

Yet another method for forming the porous bisque is to prepare an extrudable paste mixture which includes a powdered ceramic material, a lower melting powdered glass material, an organic binder material, and a vehicle. The paste mixture is then extruded in sheet form and heated to burn off the organic material and soften the glass material to fuse the ceramic particles together.

As indicated in FIG. 4 the next step of the process is impregnating the pores 16 of the porous ceramic bisque with an organic filler or binder as indicated by box 20. In order to fill the pores the porous bisque sheet can be dipped into a suitable liquid material such as liquid wax at a temperature to convert the wax to a liquid. Any other suitable type of material can be used, such as thermo-plastic materials such as polyvinyl alcohol in water or polyamide in alcohol. The pores of the bisque sheet can be filled by simply dipping the sheet into the liquid wherein the wax or other material will be drawn into the pores by capillary action. At the same time a relatively thin wax layer is formed on the surface of the bisque. The bisque with the pores filled with the filler or binder material is then made significantly stronger and therefore adapted to processing steps such as punching via holes, screening, and the like. The impregnated bisque sheet is dimensionally stable by reason of its unitary fused structure and thus not subject to the usual dimensional instability problems of green sheet processing.

The processing step of punching holes, screening circuit patterns, and the like is indicated in FIG. 4 by block 22. The via holes in the impregnated ceramic bisque can be formed by conventional mechanical punching, E-beam processing, or laser beam drilling. The circuit pattern normally formed of a conductive paste can be applied by conventional masking and screening techniques, or any other suitable method. A preferred technique for forming the circuit pattern is to form a thin layer of wax material on the surface of the impregnated bisque, which can be achieved during the impregnation step, and subsequently forming line openings in the wax layer and also remove wax from pores in the surface of the bisque in the form of circuitry patterns that extend through the layer and into the bisque. The line openings can be formed by exposing the surface of the impregnated bisque to a low energy electron beam. The electron beam is programmed to cut a given pattern of lines in the wax. An E-beam of high energy can also be used to form via holes during this same operation, if desired. A particular advantage in this technique is that no ceramic particles are ejected into the E-beam chamber when the circuitry pattern is cut by the low energy E-beam since they are held in place by the glass material, or the partially fused low melting ceramic material as in the alternate embodiment. In the E-beam machining of conventional green sheet the ceramic particles are not bound and enter the E-beam chamber, frequently accumulating in locations that cause problems. The ceramic particles in the areas where the wax has been removed on the bisque sheet of the invention can be released by exposing the sheet to hydrofluoric acid or a fluoride which dissolves the glass binder. This results in the formation of a recessed circuit pattern on the surface of the impregnated bisque sheet. The openings in the organic material layer and the recessed pattern is then filled with a suitable conductive paste preferably by doctor blading, and wiping away the surplus paste. It is apparent that the vehicle in the paste must be selected so as not to attack the coating material on the bisque. The via holes can also be filled at the same time by the same operation.

Figure 3:
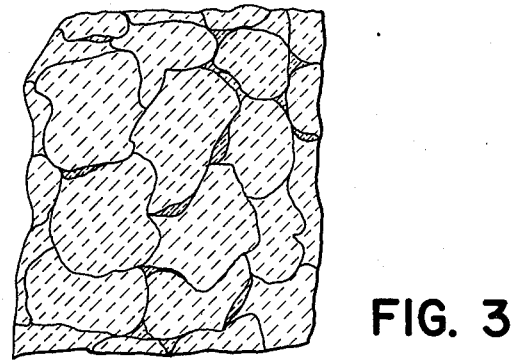
Figure 5C:

The next step in the process of laminating a plurality of porous ceramic bisque sheets is indicated by box 24 on FIG. 4. The punched and printed impregnated bisque sheets are selected, stacked, and aligned to form a laminated unit in basically the same manner as conventional green sheet is assembled. The laminated unit is then sintered as depicted in FIG. 4, box 26, preferably under pressure a temperature sufficient to burn off the filler material and subsequently sinter the ceramic particles into a unit having the grain structure illustrated in FIG. 3. An actual micrograph of a sample magnified 2,000 times the sintered sheet is shown in FIG. 5C. At this point in the process there is a significant shrinkage of the green sheet since the sintering results in a reforming of the ceramic to fill the pores previously occupied by filler material. Typical sintering temperatures are of the order of 1400° C. The aforementioned sintering operation is preferably accomplished by placing the laminated unit into a furnace at a temperature high enough to initially burn off the filler material i.e., 450° C. and subsequently raise the temperature to the sintering temperature of the ceramic. The conductive material in the paste must be a refractory material, such as molybdenum or tungsten, when high sintering temperatures are used. However, in the case of a lower melting ceramic material a lower melting conductive material may be used such as copper, gold or gold plated nickel particles. These materials can be generally used with a sintering temperature below 900° C.

EXAMPLE I

A large sheet of ceramic green sheet material was fabricated by doctor blading a slurry which was composed of 63 weight percent ceramic powder and 37 weight percent organic binder. The ceramic powder was composed of 89 weight percent of $Al_2O_3$ and 11 weight percent glass frit. The glass frit was a product of Pemco Products Glidden-Durke Division, Baltimore, Maryland. It was composed of 24 weight percent ceramatalc, 63% Kaolin-Ajax P, 2.5% Cab-O-Sil, and 10.5% $CaCO_3$. This mixture resulted in a frit having the following oxide composition:
CaO: 7.1 wt%
MgO: 8.85 wt% $SiO_2$: 54.9 wt% $Al_2O_3$: 29.0 wt%

The organic binder composition was made up of the following components;

| Butvar B98 (polyvinyl butural resin) | 11.5 wt % |
|---|---|
| Di butyl pythalate (plasticizer) | 3.9 wt % |
| Tergitol (wetting agent) | 2.5 wt % |
| Cyclohexanone (solvent) | 43.6 |
| Ethanol (solvent) | 15.4 wt % |
| Toluene (solvent) | 23.1 |
| | 100.00% |

The large green sheet was cut up into a plurality of smaller sheets for testing purposes. Four separate sets of sheets were heated for two hours at 750° C., at 850° C., 950° C. and 1100° C. respectively. The sheets heated at 750° C. were very fragile and could not be handled without breaking. The sheets heated at 850° C. were also fragile but were significantly better than the foregoing set. The sheets heated at 900° C. could be handled without breaking, but with difficulty. The sheets heated at 1100° C. were rigid and could be handled without breaking. These sheets upon inspection proved to be quite porous, as were all of the other sheets discussed. The greater degree of strength in the sheets heated at 1100° C. was believed due to adherence of the ceramic particles with melted glass. The sheets heated at 1100° C. were then impregnated with a binder agent by dipping in a filler wax substance. The wax was Carlisle synthetic wax No. 275, a product of Carlisle Chemical Works, Inc., Cincinnati, Ohio, which is an ivory colored wax composed of bis-stearoylamide. The porous bisques were impregnated in just a few seconds in the melted wax. A surface coating of the wax material was also formed which appeared to have a thickness on the order of 0.001 inch. Via holes were formed through the impregnated bisque sheet and lines cut into the surface wax with an E-beam, which also removed the wax between the exposed ceramic structure of the bisque. The E-beam cutting was done by forming 55 micron diameter spots in 10 micron steps at 100 Kev. The E-beam machine setting was 1.5 milliamps for five microseconds for each spot formed. Upon inspection, the substrate surface of the bisque was exposed through the surface wax layer. The impregnated bisques were then dipped into an acquenous 48% HF solution for about ten minutes. The bisques had a deep groove in the bisque sheet which proved to be as deep as it was wide with substantially all of the aluminuma particles removed. A conductive paste with a refractory metal was placed in the grooves. A plurality of the ceramic impregnated bisques were then stacked and sintered at 1450° C. under a slight pressure for a time of about 3 hours. Upon cooling, the resultant ceramic unit proved to be a unitary dense and impervious ceramic structure suitable for use as a multi-layer ceramic package.

EXAMPLE II

A mixture of ceramic powder particles consisting of 89 wt% milled alumina, "A-14" and 11% of a frit of the composition listed in Example I was placed in a flat metal die, pressed to compact the powder, and heated in air to 1100° C. for two hours.

A porous ceramic body was formed which could be impregnated with a solution in methylalcohol of 75% by weight of polyvinyl butyral and 25% by weight of dibutyl phthalate.

After evaporation of the solvent a sheet was formed which could be treated as described in Example I.

EXAMPLE III

A ceramic powder containing

| 68.6 wt % | eutectic lead bisilicate #356 of Hammond Lead Products Inc. |
|---|---|
| 13.3 wt % | Georgia K-4 ($Al_2O_3$ . 4 $SiO_2$ . 9$H_2O$) A product of Georgia Kaolin C., Elizabeth, New Jersey. |
| 13.3 wt % | Edgar Plastic Kaolin (source of $Al_2O_3$, $SiO_2$) A product of Edgar Plastic Kaolin Co., Edgar, Florida. |
| 4.8 wt % | XA-16 $Al_2O_3$-powder, a product of Aluminum Co. of America, Pittsburgh, Pennsylvania. |
| 100.0 wt % | | is placed in a flat metal die, compacted by stamping and heated in air to about 550° C. to form a porous bisque which can be handled as a single piece.

The porous sheet is impregnated with a solution of 10% polyamide in methanol. The methanol is allowed to evaporate. A sheet results which is dimensionally stable and which can be handled and fabricated into multi-layered ceramic modules by the steps described in Example I using a paste containing copper or gold particles instead of molybdenum paste.

While the invention has been particularly shown and described with reference to preferred embodiments thereof, it will be understood by those skilled in the art that various changes in form and detail may be made therein without departing from the spirit and scope of the invention.

What is claimed is:

1. A method of making a multi-layer ceramic substrate for an integrated circuit device package having internal circuitry comprising:

forming a plurality of porous ceramic bisque sheets by shaping a mixture which includes (1) a powdered ceramic material; (2) a lower melting powdered glass material; and (3) an organic binder material, and subsequently heating the resultant shaped sheet at a temperature less than the sintering temperature of the ceramic material but at least as high as the softening temperature of the glass material, said heating operative to adhere the particles of ceramic material with the glass material and burn off the binder material, impregnating the pores of said bisque sheets with an organic binder material, forming openings through said impregnated bisque sheets, filling said openings with conductive material, imprinting conductive circuitry patterns on the surface of said impregnated bisque sheets of a conductive material, assembling said plurality of apertured printed, impregnated bisque sheets into a laminated unit, sintering said laminated unit to form a unitary laminated structure having an interconnected internal circuitry system.

2. The method of claim 1 wherein said porous ceramic bisque sheets are formed by preparing a slurry which includes a high melting ceramic powdered material, a lower melting powdered glass material, an organic resin binder material, and a volatile solvent for the resin binder, doctor blading the slurry into a thin layer, heating to drive off the solvent, thereby leaving a pliable green ceramic sheet, heating said ceramic green sheet at a temperature and a time sufficient to burn off said resin binder, melt said glass material, and adhere said ceramic particles with said glass into a porous sheet.

3. The method of claim 2 wherein said ceramic powdered material is a material selected from the group consisting of alumina, ferrites, titanates and mixtures thereof, said powdered glass material is a material selected from the group consisting of lead silicate, and mixtures thereof, said resin binder material is a material selected from the group consisting of wax, polyvinyl, butyral, polamide, polyvinylalcohol, polyvinyl chloride, polystyrene, polyethylene, polyvinylacetate and mixtures thereof.

4. The method of claim 3 wherein said ceramic green sheet is initially heated at a temperature on the order of 450° C. until the binder resin is burned off, and the temperature subsequently increased to approximately 1100° C. until the glass softens and fuses the ceramic particles into a matrix.

5. The method of claim 1 wherein the porosity of said ceramic bisque sheets is in the range of 30 to 55%.

6. The method of claim 1 wherein said porous ceramic bisque sheets are formed by preparing a mixture of a high melting powdered ceramic material, and a lower melting powdered glass material, hot pressing said mixture at a temperature above the softening point of the glass material but below the softening point of the ceramic material for a time sufficient to produce a fused particle matrix sheet with a porosity in the range of 30 to 55%.

7. The method of claim 6 wherein said powdered ceramic material is a material selected from the group consisting of alumina, ferrites, titanates, and mixtures thereof, said powdered glass material is a material selected from the group consisting of lead silicate, borosilicate or soda-lime glass and mixtures thereof.

8. The method of claim 7 wherein the hot pressing temperature is in the range of 450° to 750° C.

9. The method of claim 1 wherein said bisque is impregnated with a wax material.

10. The method of claim 1 where said bisque is impregnated with a thermoplastic material, selected from the group consisting of polyvinyl butyral, polyvinylalcohol, polyamide and mixtures thereof dissolved in a suitable solvent.

11. The method of claim 1 wherein said bisque is formed by hot pressing a powdered low melting ceramic or a glass material at a temperature and a time sufficient to coalesce the particles into a porous sheet matrix with a porosity in the range of 45 to 55%.

12. The method of claim 11 wherein said material is selected from the group consisting of lead silicate, borosilicate, soda-lime glass and mixtures thereof, and said hot pressing temperature is in the range of 450° to 750° C.

13. The method of claim 1 wherein said bisque is formed by preparing an extrudable paste mixture comprising:
a powdered ceramic material
a lower melting powdered glass material
an organic binder material extruding the paste mixture into sheet form, heating the sheet at an initial temperature to burn off the organic binder material, and at a second higher temperature above the softening point of the glass material to fuse the ceramic particles together with softened glass materials.

14. The method of claim 1 wherein said openings are formed by mechanical punching techniques.

15. The method of claim 1 wherein said openings are formed by E-beam techniques.

16. The method of claim 1 wherein said openings are formed with a laser beam.

17. The method of claim 1 wherein said bisque is comprised of a matrix of ceramic particles adhered together with glass material, the porosity of the bisque being in the range of 15 to 70%.

18. The method of claim 17 wherein conductive circuitry patterns are formed by forming a thin layer of wax material on the surface of the impregnated bisque forming line openings in the layer to form circuitry patterns that extend through the layer and expose the surface of the impregnated bisque, exposing the sheet to hydrofluoric acid to dissolve the glass exposed by the openings and thereby release the ceramic particles, removing the loose ceramic particles, filling the resultant open channels with a conductive paste material.

19. The method of claim 18 wherein said line openings are formed with an E-beam.

20. The method of claim 19 wherein said open channels are filled with paste material by doctor blading the material over the surface of the bisque, and subsequently wiping the excess material.

21. The method of claim 19 wherein said openings through said bisque are formed with an E-beam at the same time line openings are formed in said layer of wax material.

* * * * *